United States Patent
Zhao et al.

(10) Patent No.: US 9,548,212 B2
(45) Date of Patent: Jan. 17, 2017

(54) SEMICONDUCTOR DEVICES AND FABRICATION METHOD THEREOF

(71) Applicant: Semiconductor Manufacturing International (Shanghai) Corporation, Shanghai (CN)

(72) Inventors: Jian Zhao, Shanghai (CN); Hangping Wang, Shanghai (CN)

(73) Assignee: SEMICONDUCTOR MANUFACTURING INTERNATIONAL (SHANGHAI) CORPORATION, Shanghai (CN)

(*) Notice: Subject to any disclaimer, the term of this patent is extended or adjusted under 35 U.S.C. 154(b) by 10 days.

(21) Appl. No.: 14/571,831

(22) Filed: Dec. 16, 2014

(65) Prior Publication Data

US 2015/0287611 A1 Oct. 8, 2015

(30) Foreign Application Priority Data

Apr. 3, 2014 (CN) .......................... 2014 1 0133524

(51) Int. Cl.
*H01L 27/11* (2006.01)
*H01L 21/3105* (2006.01)
*H01L 21/02* (2006.01)
*H01L 27/088* (2006.01)
*H01L 21/8234* (2006.01)

(52) U.S. Cl.
CPC ... *H01L 21/31053* (2013.01); *H01L 21/02164* (2013.01); *H01L 21/02211* (2013.01); *H01L 21/02216* (2013.01); *H01L 21/02274* (2013.01); *H01L 21/823437* (2013.01); *H01L 27/088* (2013.01)

(58) Field of Classification Search
CPC .. H01L 29/6659; H01L 27/11; H01L 27/1104; H01L 27/0207; H01L 21/823807
USPC ........................................................ 257/368
See application file for complete search history.

(56) References Cited

U.S. PATENT DOCUMENTS

2012/0252180 A1* 10/2012 Tomimatsu ......... H01L 27/1104
438/299

* cited by examiner

*Primary Examiner* — Monica D Harrison
(74) *Attorney, Agent, or Firm* — Anova Law Group, PLLC

(57) ABSTRACT

A method is provided for fabricating a semiconductor device. The method includes providing a substrate having a device region and a peripheral region; and forming device structures on the substrate in the device region so as to form trenches between adjacent device structures. The method also includes forming a stop layer on the substrate and the device structures; and forming a first dielectric layer on the stop layer such that a portion of the densified first dielectric layer fills the trenches and a top surface of a portion of the first dielectric layer in the peripheral region is lower than a surface of the stop layer on the device structures by a densify high aspect ratio process. Further, the method includes forming a second dielectric layer on the densified first dielectric layer; and performing a plurality of polishing processes until the top surface of the device structures is exposed.

19 Claims, 6 Drawing Sheets

SEMICONDUCTOR DEVICES AND FABRICATION METHOD THEREOF

CROSS-REFERENCES TO RELATED APPLICATIONS

This application claims the priority of Chinese patent application No. 201410133524.8, filed on Apr. 3, 2014, the entirety of which is incorporated herein by reference.

FIELD OF THE INVENTION

The present invention generally relates to the field of semiconductor manufacturing technology and, more particularly, relates to semiconductor devices and fabrication techniques thereof.

BACKGROUND

With the rapid development of integrated circuit (IC) technology, the size of the semiconductor devices of ICs, especially the metal oxide semiconductor (MOS) devices, has become smaller and smaller to match the requirements of device miniaturization and integration. When the size of the MOS transistor is continually shrunk, the process using the gate dielectric layer made of silicon oxide or silicon nitride meets certain challenges. For example, the transistors having the gate dielectric layer made of silicon oxide and silicon nitride face certain problems, such as the increase of leakage current, and/or the diffusion of the impurities, etc. Such problems may affect the threshold voltage of the transistors; and the performance of the semiconductor devices may be significantly affected.

In order to solve the above-mentioned problems, a high-K metal gate (HKMG) structure) has been introduced into the MOS transistors. The HKMG structure utilizes a high dielectric constant (high-K) material to substitute the conventionally used gate dielectric material, such as silicon oxide and silicon nitride, etc. The HKMG structure may reduce the leakage current of the transistor when the size of the transistor is reduced; and the performance of the transistor may be improved as well.

However, when the technical node of semiconductor process is further reduced, the size of transistors having HKMG structures is consistently reduced; and the device density is continuously increased, thus it may be difficult to control the fabrication process of the HKMG structures; and the performance of the transistors having the HKMG structures may be unstable. The disclosed device structures and methods are directed to solve one or more problems set forth above and other problems.

BRIEF SUMMARY OF THE DISCLOSURE

One aspect of the present disclosure includes a method for fabricating a semiconductor device. The method includes providing a substrate having a device region and a peripheral region; and forming a plurality of device structures on a surface of the substrate in the device region so as to form trenches between adjacent device structures. The method also includes forming a stop layer on the surface of the substrate and the device structures; and forming a first dielectric layer with an increased hardness on the stop layer such that a portion of the first dielectric layer fills the trenches in the device region and a top surface of a portion of the first dielectric layer in the peripheral region is lower than a surface of the stop layer on the top surface of the device structures by a densify high aspect ratio process. Further, the method includes forming a second dielectric layer on the densified first dielectric layer; and performing a plurality of polishing processes onto the second dielectric layer and the densified first dielectric layer until a top surface of the device structures is exposed.

Another aspect of the present disclosure includes a semiconductor device. The semiconductor device includes a substrate having device regions and peripheral regions; and a plurality of high-K metal gate structures formed on the surface of the substrate in the device regions. The method also includes an isolation structure formed in the substrate in the peripheral region; and a stop layer formed on the surface of the substrate. Further, the method includes a densified first dielectric layer with an increased hardness formed on the surface of the stop layer by a densify high aspect ratio process.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
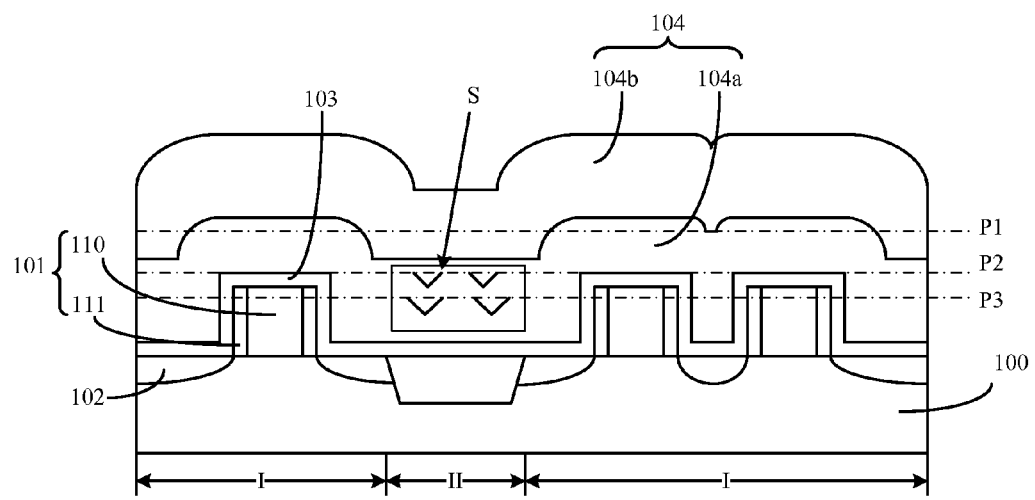
FIG. 1 illustrates a transistor with a dummy gate structure.

The transistor having an HKMG structure may be formed by a gate-last process, FIG. 1 illustrates a transistor having an HKMG structure formed by a gate-last process. As shown in FIG. 1, the process includes forming a plurality of dummy gate structures 101 on the device region I of the surface of the substrate 100. The dummy gate structure 101 includes a dummy gate electrode 110 and a sidewall spacer 111 formed on the side surface of the dummy gate electrode 110. The process also includes forming source/drain regions 102 in the substrate 100 at both sides of the dummy gate structures 101 by an ion implantation process. Further, the process also includes forming a stop layer 103 on the surface of the substrate 100 and the dummy gate structures 101; and forming a dielectric layer 104 on the stop layer 103. The surface of the dielectric layer 104 is higher than the top surface of the dummy gate structures 101. Further, the process also includes polishing the dielectric layer 104 until the top surface of the dummy gate structures 101 is exposed. The stop layer 103 defines the stop point of the polishing process. Further, the process also includes removing the dummy gate electrode 110 to form an opening in the dielectric layer 104; forming a high-K dielectric layer on the side surface and the bottom surface of the opening; and forming a metal gate on the high-K dielectric layer.

With continuously shrinking the technical node of semiconductor process, the size of the dummy gate structures 101 is continuously reduced; and the distance between adjacent dummy gate structures 101 is also continuously reduced, thus the depth-to-width ratio of the gaps between adjacent dummy gate structures 101 is increased as well. Therefore, a high aspect ratio process chemical vapor deposition (HARP CVD) process is used to form the dielectric layer 104. Referring to FIG. 1, the dielectric layer 104 includes a first dielectric layer 104a and a second dielectric layer 104b. The first dielectric layer 104a is formed by the HARP CVD process. The first dielectric layer 104a is used to fill the gaps between adjacent dummy gate structures 101. However, the first dielectric layer 104a formed by the HARP CVD process is relatively loose, the polishing process has a relatively fast polishing rate to the first dielectric layer 104a; thus the thickness of the first dielectric layer 104a is relatively large so as to cause the surface of the first dielectric layer 104a to be higher than the top surface of the dummy gate structures 101. Further, the second dielectric layer 104b is formed on the first dielectric layer 104a by a plasma-enhanced CVD (PECVD process. The second dielectric layer 104b is relatively dense, thus the polishing process may be easy to control.

The polishing process of the dielectric layer 104 includes three steps: a first polishing step P1, a second polishing step P2 and a third polishing step P3. Referring to FIG. 1, the first polishing step P1 uses polishing slurry to polish; and the first polishing step P1 stops at the surface of the first dielectric layer 104a on the top surface of the dummy gate structures 101. After the first polishing step P1, the second polishing step P2 is performed; and the second polishing step P2 stops at the surface of the stop layer 103. Because the density and the type of the material polished by the second polishing step P2 are relatively complex, a fixed abrasive is also used for the second polishing step P2. That is, a polishing chemical and a fixed abrasive are both used in the second polishing step P2 to obtain an even polishing surface. Further, after the second polishing step P2, the third polishing step P3 is performed; and the third polishing step P3 exposes the dummy gate electrode 110 of the dummy gate structure 101.

However, most surface of the first dielectric layer 104a formed by the HARP CVD process are higher than the top surface of the dummy gate structure 101, especially SRAM and dense logic function area; and the first dielectric layer 104a formed by the HARP CVD process may be relatively soft, thus the second polishing step P2 using the fixed abrasive may generate scratches on the polished surface of the first dielectric layer 104a. The scratches may get worse in the third polishing step P3, as illustrated in the "S" region in FIG. 1. When the dummy gate electrode 110 is subsequently removed; and a high-K dielectric layer and a metal gate is formed in the opening, the scratches may leave some high-K dielectric and/or metal residues. Such residues may cause a leakage current to be generated between adjacent metal gates; and the transistor may be unstable.

To solve such issues, a semiconductor fabrication process may be provided. According to the disclosed fabrication process, the first dielectric layer may be formed by a density high aspect ratio process, the density of the first dielectric layer may be increased, thus the densified first dielectric layer does not need to be unnecessarily thick, and it may only need to fill the trenches between adjacent device structures. Further, when the trenches are filled by the densify high aspect ratio process, it may ensure that the surface of the densified first dielectric layer in the peripheral region to be lower the surface of the stop layer on the top surface of the device structures. When the subsequent second polishing process is performed to planarize the first polishing surface to form the second polishing surface, the surface of the first dielectric layer in the peripheral region may have a second distance with the second polishing surface. That is, only the second dielectric layer is exposed by the second polishing surface in the peripheral region. Because the second dielectric layer much harder than the first dielectric layer, the second polishing process may not scratch the surface of the first dielectric layer in the peripheral region, thus it may be able to ensure the second polishing surface to be even and smooth such that the third polishing surface formed by the subsequent third polishing process may be kept even and smooth as well. Therefore, the subsequent processes may not form residues on the third polishing surface, it may prevent forming a leakage current between adjacent device structures; and the performance of the formed semiconductor devices may be stable.

Figure 11:
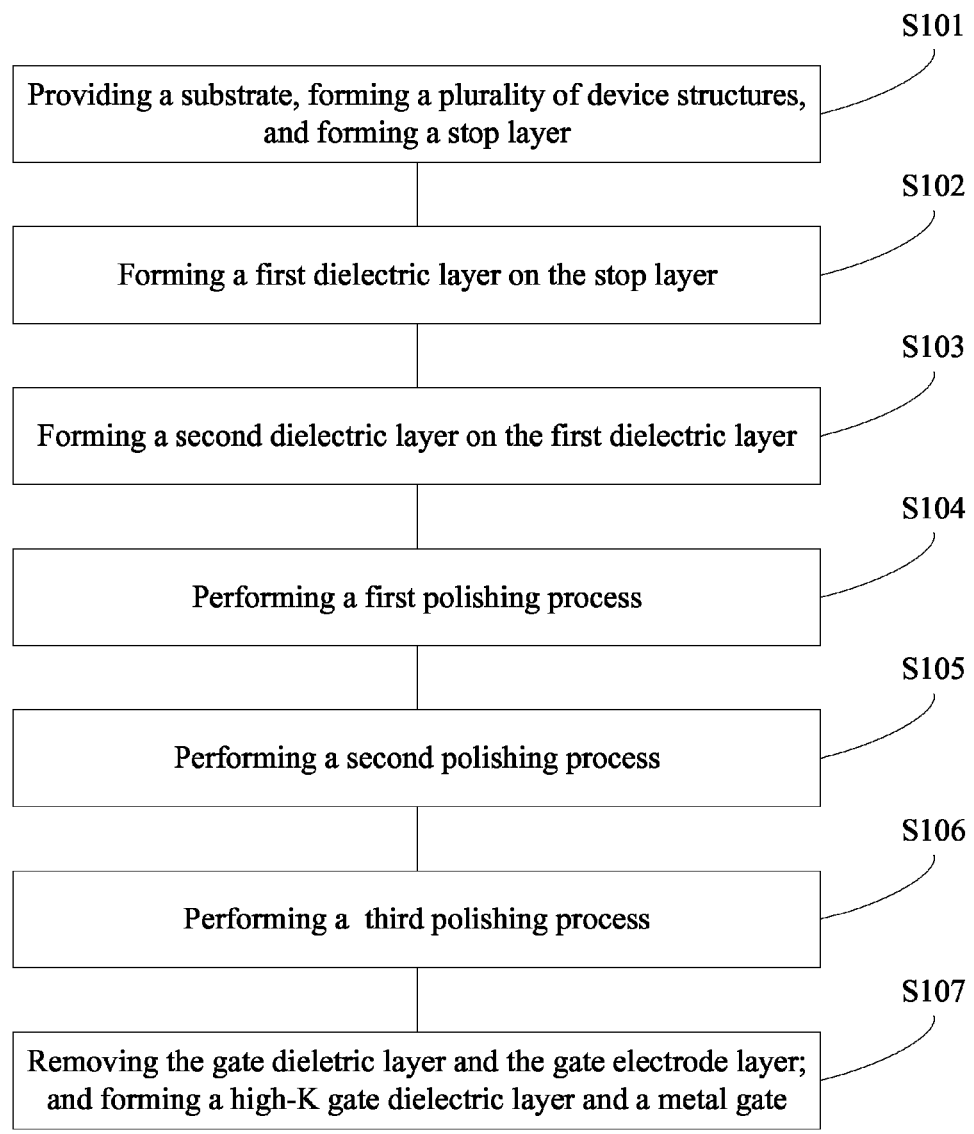
FIG. 11 illustrates an exemplary fabrication process of a semiconductor device consistent with the disclosed embodiments.

FIG. 11 illustrates an exemplary fabrication process of a semiconductor device consistent with the disclosed embodiments; and FIGS. 2~8 illustrate exemplary semiconductor structures corresponding to various stages of the fabrication process.

Figure 2:
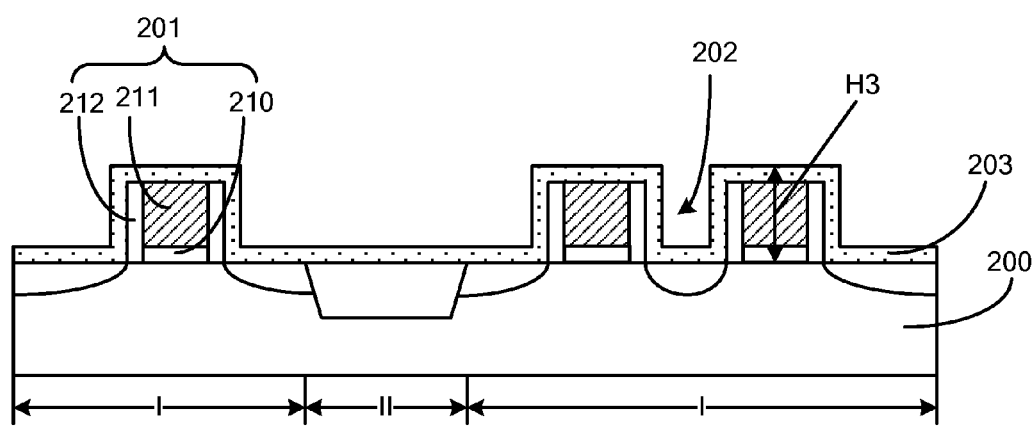
FIGS. 2~8 illustrate semiconductor structures corresponding to certain stages of a fabrication process of a semiconductor device consistent with the disclosed embodiments.

As shown in FIG. 11, at the beginning of the fabrication process, a substrate with certain structures is provided (S101). FIG. 2 illustrates a corresponding semiconductor structure.

As shown in FIG. 2, a semiconductor substrate 200 is provided. The semiconductor substrate 200 may have a first region I and a second region II. For illustrative purposes, the first region I may be referred as a device region I; and the second region II may be referred as a peripheral region II.

Further, a plurality of device structures 201 may be formed on the surface of the substrate 200 in the device region I; and a plurality of trenches 202 may be formed between adjacent device structures 201 as a result. Further, a stop layer 203 may be formed on the surface of the substrate 200 and the device structures 201.

The substrate 200 may include any appropriate semiconductor materials, such as silicon, silicon on insulator (SOI), silicon germanium, germanium on insulator (GOI), carborundum, indium antimonide, lead telluride, indium arsenide, indium phosphide, gallium arsenidie, gallium nitride, gallium antimonite, alloy semiconductor or a combination thereof. The substrate 200 may also be a glass substrate. In one embodiment, the semiconductor substrate 200 is silicon. The substrate 200 provides a base for subsequent processes and structures.

The device region I may be configured to form the core devices of the chip circuit; and the device density in the device region I may be relatively high. The peripheral region II may be configured to form peripheral devices of the chip circuit; and/or to be used as an isolation region of device regions I. The device density of the peripheral region II may be relatively low, or no device is formed in the peripheral region II. In one embodiment, the peripheral region is configured to isolate adjacent device regions I. Shallow trench isolation (STI) structures may be formed in the peripheral region II.

The device structures 201 may be any appropriate type of devices and/or structures. In one embodiment, the device structures 201 are gate structures. Referring to FIG. 2, the gate structure may include a gate dielectric layer 210 formed on the surface of the substrate 200; a gate electrode layer 211 formed on the surface of the gate dielectric layer 210 and a sidewall spacer 212 formed on both sides of the gate dielectric layer 210 and the gate electrode layer 211.

The gate dielectric layer 210 may be made of any appropriate material, such as silicon oxide, silicon nitride, silicon oxynitride, etc. In one embodiment, the gate dielectric layer 210 is made of silicon oxide.

The gate electrode layer 211 may be made of any appropriate material, such as Cu, Al, Au, or poly silicon, etc. In one embodiment, the gate electrode layer 211 is made of poly silicon.

The sidewall spacer 212 may be a single layer structure or a multiple-stacked structure. The sidewall spacer 212 may be made one or more of silicon oxide, silicon nitride, or silicon oxynitride, etc.

A process for forming the gate structure may includes sequentially forming a gate dielectric film (not shown) on the surface of the substrate 200; forming a gate electrode film (not shown) on the surface of the gate dielectric film; forming a mask layer (not shown) defining the position and shape of the gate electrode layer 211 and the gate dielectric layer 210 on the surface of the gate electrode film; etching the gate electrode film and the gate dielectric film using the mask layer as an etching mask until the surface of the substrate 200 is exposed. Thus, the gate dielectric layer 211 and the gate electrode layer 210 may be formed. After forming the gate dielectric layer 211 and the gate electrode layer 210, a sidewall spacer material layer (not shown) may be formed on the surface of the gate dielectric layer 211 and the gate electrode layer 210; and followed by an etch back process to expose the surface of the substrate 200 and the mask layer.

Various processes may be used to form the gate dielectric film, such as thermal oxidation process, a chemical oxidation process, a chemical vapor deposition (CVD) process, a physical vapor deposition (PVD) process, or an atomic layer deposition process (ALD), etc. The gate electrode film and the sidewall spacer material layer may be formed by any appropriate process, such as a CVD process, a PVD process, an ALD process, or a flowable CVD (FCVD) process, etc.

The mask layer may be made of any appropriate material, such as silicon oxide, silicon nitride, silicon oxynitride, amorphous carbon, or photoresist, etc. The mask layer may be formed by a CVD process, a PVD process, an ALD process, or an FCVD process, etc. In one embodiment, the mask layer may be removed after forming the device structures 201. In certain other embodiments, the mask layer may be kept after forming the device structures 201, thus the mask layer may protect the gate electrode layer 211 in subsequent processes.

In one embodiment, the device structures 201 may be configured as dummy gate structures, an opening may be subsequently formed by removing the gate electrode layer 211 and the gate dielectric layer 210; and a high-K gate dielectric layer and a metal gate may be sequentially formed in the opening. Thus, the devices structures 201 may be referred as dummy gate structures. Further, source/drain regions (not labeled) may be formed in the substrate 200 at both sides of the device structures 201 by an ion implantation process before removing the gate electrode layer 211 and the gate dielectric layer 210. Such a process may be referred as a gate-last process.

In certain other embodiments, the device structures 201 may be directly used as the gate structures of transistors. Thus, the gate dielectric layer of the transistor is a silicon oxide layer; and the gage electrode layer is a poly silicon layer.

After forming the source/drain regions, the stop layer 203 may be formed. The stop layer 203 may define the stop position of a subsequent polishing process; and another polishing process may be subsequently performed to expose the surface of the gate electrode layer 211. The stop layer 203 may be made of any appropriate material. In one embodiment, the stop layer 203 may be made of a material different from that of a subsequently formed first dielectric layer such that the stop layer 203 and the first dielectric layer 203 may have a polishing and/or etching selectivity. In one embodiment, the stop layer 203 is made of silicon nitride. Various processes may be used to form the stop layer 203, such as a CVD process, a PVD process, an FCVD process, or an ALD process, etc.

Referring to FIG. 2, in one embodiment, the distance H3 between the surface of the substrate 200 and the top surface of the stop layer 203 formed on the top surface of the device structures 201 may be in a range of approximately 650 Å~750 Å. After subsequently forming a first dielectric layer, the thickness of the first dielectric layer in the peripheral region II may need to be smaller than the distance H3. Such a distance and thickness combination may ensure a subsequently formed second polishing surface not to expose the surface of the first dielectric layer in the peripheral region II.

Because the device density in the device region I may be relatively large, the distance between adjacent devices in the first region I may be relatively small. However, in order to ensure the stability of the device structures 201, the height of the device structures 201 may not be correspondingly reduced, thus the depth-to-width ratio of the trenches 202 between adjacent device structures 201 may be relatively large. In one embodiment, the depth-to-width ratio of the trenches 202 between adjacent device structures 201 may be greater than approximately 5:1.

Figure 3:
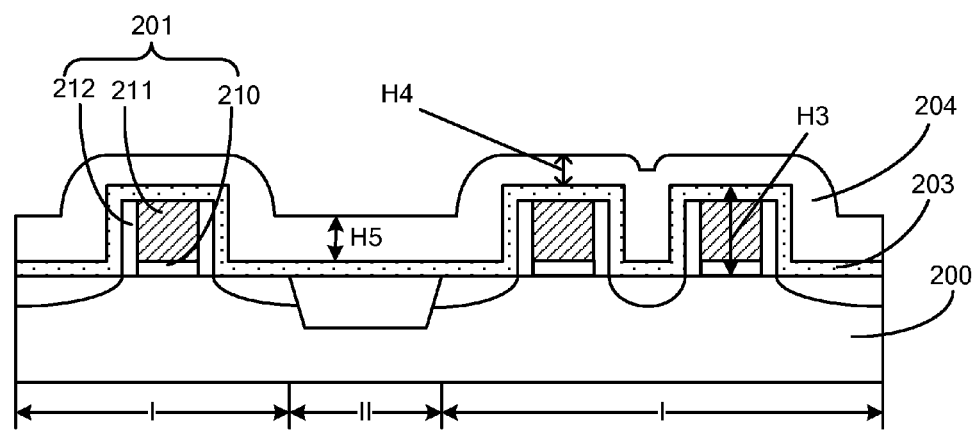

Returning to FIG. 11, after forming stop layer 203, a first dielectric layer may be formed (S102). FIG. 3 illustrates a corresponding semiconductor structure.

As shown in FIG. 3, a first dielectric layer 204 is formed on the surface of the stop layer 203. The first dielectric layer 204 in the device region I may fill the trenches 202; and the top surface of the first dielectric layer 204 may be lower than the top surface of the stop layer 203 on the top surface of the device structures 201. That is, the first dielectric layer 204 may be thinner than the dielectric layer 104 formed by the method illustrates in FIG. 1.

The first dielectric layer 204 may be used to electrically isolate the adjacent devices structures 201. Further, in one embodiment, if the semiconductor device is a transistor having a high-K metal gate structure, the first dielectric layer 204 and the subsequently formed second dielectric layer may be used to reserve the shape and the position of the device structures 201 such that a high-K dielectric layer and a metal gate may be formed at the position of the devices structures 201.

The first dielectric layer 204 may be made of any appropriate material, such as silicon oxide, silicon nitride, or silicon oxynitride, etc. In one embodiment, the first dielectric layer 204 is made of silicon oxide.

Various processes may be used to form the first dielectric layer 204, such as a CVD process, a PVD process, an ALD process, or an FCVD process, etc. In one embodiment, the first dielectric layer 204 is formed by a densify deposition process. The densify deposition process is a high aspect ratio disposition process (HARP), thus the densify deposition process may be referred as a densify HARP. The densify HARP may refer to a sub-atmosphere CVD process using tetraethyl orthosilicate (TEOS) and ozone as precursors to form a dielectric layer. The first dielectric layer 204 formed by the densify HARP may fill up the trenches 202 with a relatively high depth-to-width ratio, and may not form vacancies in the trenches 202, thus the isolation effects to the adjacent device structures 201 may be desirable.

In one embodiment, the first dielectric layer 204 is made of silicon oxide. The flow of the TEOS of the densify HARP may be in a range of approximately 400 sccm~1000 sccm. The flow of the ozone of the densify HARP may be in a range of approximately 1800 sccm~3000 sccm. The pressure of the densify HARP may be in a range of approximately 500 Torr~800 Torr. The temperature of the densify HARP may be in a range of approximately 400° C.~450° C. The radio-frequency power of the densify HARP may be in a range of approximately 440 W~2000 W.

The flow of the deposition gases of the densify HARP may be relatively low, thus the deposition rate for forming the first dielectric layer 204 may be relatively low. The reduced deposition rate may be able to increase the density of the first dielectric layer 204. That is, the first dielectric layer is may be densified. Correspondingly, the hardness of the first dielectric layer 204 may be increased. Thus, the polishing rate of the subsequent polishing process to the first dielectric layer 204 may be reduced; and the first dielectric layer 204 may be kept stable during the subsequent polishing processes. The uneven surface of the subsequently formed first polishing surface and second polishing surface may be avoided.

Further, the densify HARP is a high aspect (height-to-width) ratio process, the dielectric material formed by the densify HARP may be formed on the sidewall and the bottom surfaces of the trenches 202 simultaneously, thus the deposition rate of the first dielectric layer 204 in the trenches 202 in the device region I may be relatively large. In the peripheral region II, the device density is relatively low, more dielectric layer material may be formed on the surface of the substrate 200, thus the thickness of the first dielectric layer 204 in the peripheral region II may be smaller than the thickness of the first dielectric layer 204 in the trenches in the device region I. Further, the density of the first dielectric layer 204 formed by the densify HARP may be increased; the density of the first dielectric layer 204 may be similar to the density of the subsequently formed second dielectric layer. Thus, the thickness of the first dielectric layer 204 does not need to be unnecessarily large. That is, the first dielectric layer 204 may be relatively thin. Such a thickness may ensure that the surface of the first dielectric layer 204 to be lower than the surface of the stop layer 203 on the top surface of the device structures 201 when the trenches 203 are filled by the first dielectric layer 204. Therefore, a subsequent second polishing process may not reach the surface of the first dielectric layer 204 in the peripheral region II, and the second polishing process may unlikely generate scratches on the surface of the first dielectric layer 204 in the peripheral region II.

Referring to FIG. 3, in one embodiment, the thickness H4 of the first dielectric layer 204 formed on the device structures 201 may be in a range of approximately 400 Å~500 Å. The thickness of the first dielectric layer 204 formed on the stop layer 203 in the peripheral region II may be in a range of approximately 500 Å~600 Å.

Figure 4:
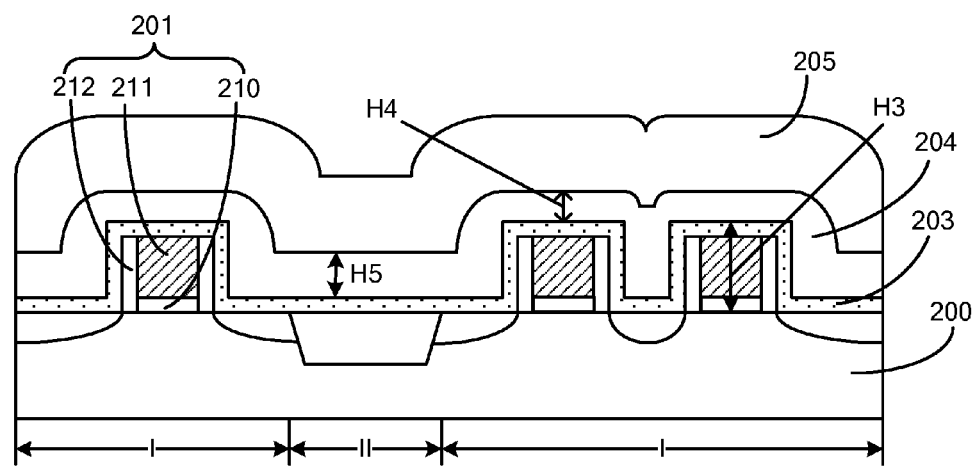

Returning to FIG. 11, after forming the first dielectric layer 204, a second dielectric layer may be formed (S103). FIG. 4 illustrates a corresponding semiconductor structure.

As shown in FIG. 4, a second dielectric layer 205 is formed on the surface of the first dielectric layer 204. The second dielectric layer 205 may be used to protect the first dielectric layer 204 and the device structures 201. In one embodiment, the surface of the first dielectric layer 204 in the peripheral region II may be lower than the surface of the stop layer 203 on the top surface of the device structures 201, the second dielectric layer 205 may be used to compensate the thickness the first dielectric layer 204 in the peripheral region II, thus the subsequently formed third polishing surface may be even. Further, in one embodiment, the second dielectric layer 205 and the first dielectric layer 204 may together keep the geometry of the device structures 201.

The second dielectric layer 205 may be made of any appropriate material, such as silicon oxide, silicon nitride, or silicon oxynitride, etc. In one embodiment, the second dielectric layer 205 is made of silicon oxide. The thickness of the second dielectric layer 205 may be in a range of approximately 2000 Å~2500 Å.

Various processes may be used to form the second dielectric layer 205, such as a CVD process, a PVD process, an ALD process, or an FCVD process, etc. In one embodiment, the second dielectric layer 205 is formed by a plasma-enhanced CVD (PECVD) process. The second dielectric layer 205 formed by the PECVD process may have a significantly high covering ability and density, thus the second dielectric layer 205 may be able to keep stable during subsequent polishing processes; and may cause the subsequently formed first polishing surface and the second polishing surface to be even and smooth.

The precursor gases of the PECVD process may include TEOS, oxygen and helium, etc. The pressure of the PECVD process may be in a range of approximately 1 Torr~10 Torr. The temperature of the PECVD process may be in a range of approximately 360° C.~420° C. The radio frequency power of the PECVD process may be in a range of approximately 400 W~2000 W. The flow of oxygen may be in a range of approximately 500 sccm~5000 sccm. The flow of TEOS may be in a range of approximately 500 sccm~5000 sccm. The flow of helium may be in a range of approximately 1000 sccm~5000 sccm.

Figure 5:
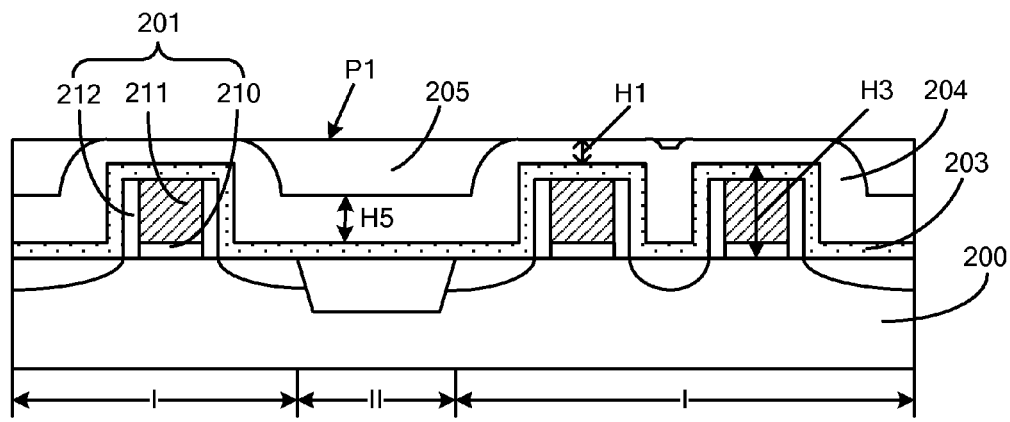

Returning to FIG. 11, after forming the second dielectric layer 205, a first polishing process may be performed (S104). FIG. 5 illustrates a corresponding semiconductor structure.

As shown in FIG. 5, a first polishing surface P1 is formed by performing the first polishing process to planarize the second dielectric layer 205. The first polishing surface P1 and the surface of the stop layer 203 on the top surface of the device structures 201 may have first distance H1.

The first polishing process may cause the first polishing surface P1 to approach the surface of the stop layer 203 on the top surface of the device structures 201. The first polishing process may be a chemical mechanical polishing (CMP) process using a polishing slurry. The polishing slurry may include a solvent and polishing particles. In one embodiment, the solvent may be an alkaline solution; and the polishing particles may be silicon oxide particles, silicon nitride particles, and silicon carbide particles, etc.

In one embodiment, the first polishing process may be performed onto the second dielectric layer 205 until the first dielectric layer 204 on the top of the device structures 201 is exposed, thus the first polishing surface P1 is formed. The first polishing surface P1 may expose a portion of the first dielectric layer 204 and a portion of the second dielectric layer 205. In one embodiment, the first distance H1 may be in a range of approximately 300 Å~450 Å.

Figure 6:
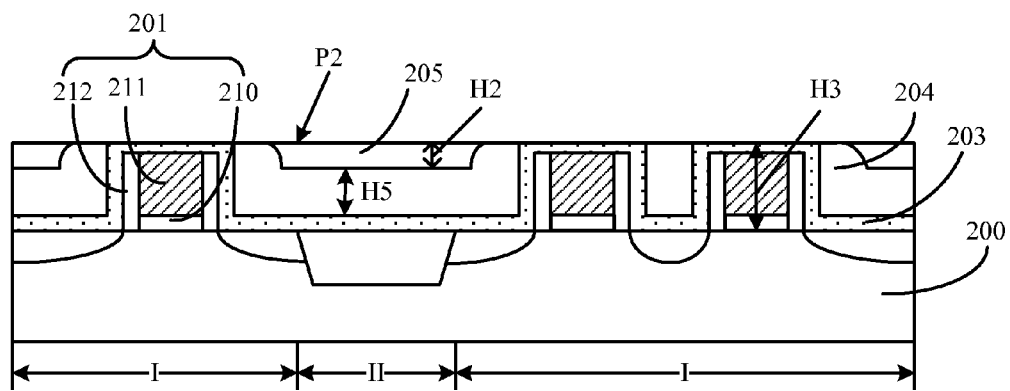

Returning to FIG. 11, after performing the first polishing process to form the first polishing surface P1, a second polishing process may be performed (S105). FIG. 6 illustrates a corresponding semiconductor structure.

As shown in FIG. 6, a second polishing surface is formed by performing a second polishing process P2 to planarize the first polishing surface P1 until the surface of the stop layer 203 on the top surface of the device structures 201 is exposed. The surface of the first dielectric layer 204 in the peripheral region I and the second polishing surface P2 may have second distance H2.

The second polishing process may be a CMP process using fixed abrasive (FA) and a polishing chemical. That is, a planar material having fixed abrasive may be used with a certain type of polishing chemicals to polish the first polishing surface P1.

The second polishing process may need to stop at the surface of the stop layer 203 on the top surface of the device structures 201; and the second polishing surface P2 may expose the stop layer 203, the first dielectric layer 204 and the second dielectric layer 205 in the peripheral region II. Further, the stop layer 203 and the first dielectric layer 204 or the second dielectric layer 205 may be made of different materials, thus the polishing rate of the stop layer 203 and the first dielectric layer 204 or the second dielectric layer 205 may be significantly different; and it may need the CMP process using fixed abrasive and a polishing chemical to perform a more precise polishing process. In the CMP process using fixed abrasive and a polishing chemical, the positions of the abrasive and the polishing surface may be fixed, thus the second polishing surface P2 may be planarized.

In one embodiment, the first dielectric layer 204 may be formed by the densify HARP; and the density and the hardness of the first dielectric layer 204 may be improved, thus the polishing rate of the first dielectric layer 204 may be reduced; and the surface differences between the first dielectric layer 204 and the second dielectric layer 205 exposed by the second polishing surface P2 may be avoided. In one embodiment, the polishing rate of the second polishing process to the first dielectric layer 204 may be in a range of approximately 3 Å/min~4 Å/min.

In one embodiment, the surface of the first dielectric layer 204 in the peripheral region II may be lower than the surface of the stop layer 203 on the top surface of the device structures 201, the second distance H2 may be in a range of approximately 150 Å~200 Å after the second polishing process. Because the second polishing process may not reach the surface of the first dielectric layer 204 in the second region II, thus it may avoid forming scratches on the surface of the first dielectric layer 204 in the peripheral region II by the second polishing process. Therefore, it may ensure the second polishing surface P2 to be relatively smooth and even; and a subsequently formed third polishing surface may also be kept smooth and even.

Figure 7:
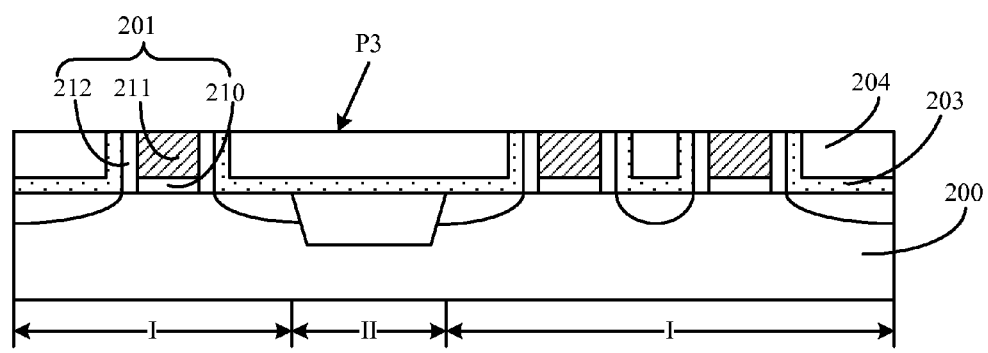

Returning to FIG. 11, after forming the second polishing surface P2, a third polishing process may be performed to form a third polishing surface (S106). FIG. 7 illustrates a corresponding semiconductor structure.

As shown in FIG. 3, a third polishing surface P3 is formed by planarizing the second polishing surface P2 by a third polishing process until the gate electrode layer 211 is exposed. After the gate electrode layer 211 is exposed, subsequent processes may be able to remove the gage electrode layer 211 and the gate dielectric layer 210; and a high-K dielectric layer and a metal gate may be subsequently formed.

The third polishing process may be a CMP process using a polishing slurry. The polishing slurry may include a solvent and polishing particles, etc. In one embodiment, the solvent may be an alkaline solution. In one embodiment, the polishing particles may be silicon oxide particles, silicon nitride particles, or silicon carbide particle, etc.

In one embodiment, the second polishing process may not reach the surface of the first dielectric layer 204 in the peripheral region II, thus it may prevent the surface of the first dielectric layer 104 in the peripheral region II from being scratched by the second polishing process; and the second polishing surface P2 formed by the second polishing process may be relatively even and smooth. Therefore, after the third polishing process, the third polishing surface P3 formed by the third polishing process may be kept even and smooth; and it may avoid forming defects on the surface of the first dielectric layer 204 exposed by the third polishing surface P3.

Figure 9:
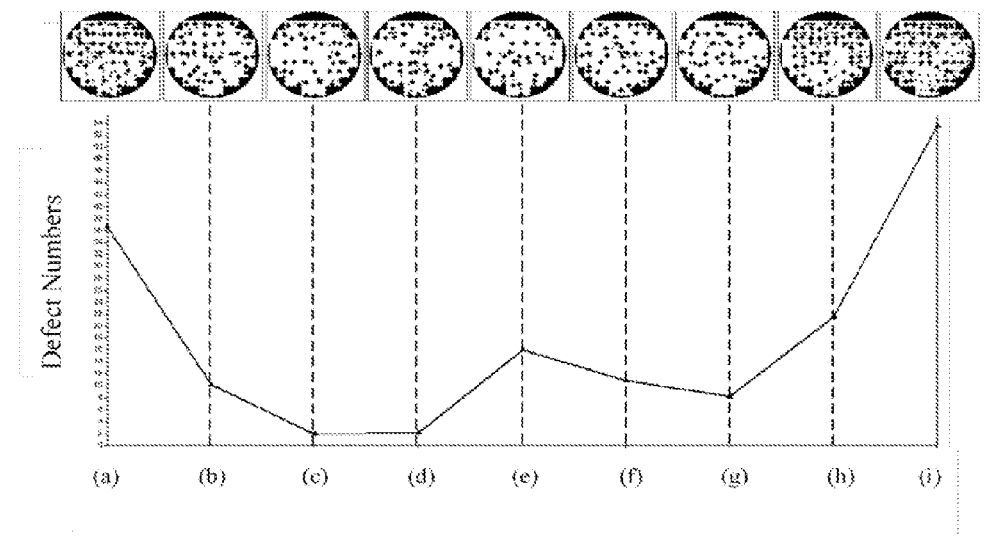
FIGS. 9~10 illustrate the defect testing results of exemplary semiconductor devices consistent with the disclosed embodiments.

FIG. 9 illustrates a comparison of defects formed on the wafers after the exposing the gate electrode layers. The semiconductor structures on the wafers are formed by the disclosed methods and existing methods.

Specifically, picture (a), picture (e), picture (h) and picture (i) shown in FIG. 9 illustrate the defect distribution and number on the wafer having the first dielectric layer 104 formed by the method illustrated in FIG. 1 under the condition that the surface of the first dielectric layer 104 is higher than the stop layer 103 on the top surface of the device structures 101. Picture (b), picture (f) and picture (g) shown in FIG. 9 illustrate the defect distribution and number on the wafer having the first dielectric layer 204 formed by the disclosed densify HARP under the condition that the surface of the first dielectric layer 204 is higher than the surface of the stop layer 203 on the top surface of the device structures 201. Picture (c) and picture (d) illustrate the defect distribution and number on the wafer having the first dielectric layer 204 formed by the disclosed densify HARP under the condition that surface of the first dielectric layer 204 is lower than the surface of the stop layer 203 on the top surface of the device structures 201.

As shown in FIG. 9, picture (c) and picture (d) illustrate less defects on the wafers after three times of polishing processes than other pictures. That is, using the disclosed densify HARP to form the first dielectric layer 204 with the surface lower than the surface of the stop layer 203 on the top surface of the device structures 201 may generate the minimum number of defects than other practices. Therefore, the semiconductor structures having the first dielectric layer 204 formed by the densify HARP and with the surface lower than the surface of the stop layer 203 on the top surface of the device structures 201, i.e., thinner first dielectric layer 204, may be significantly stable.

Figure 10:
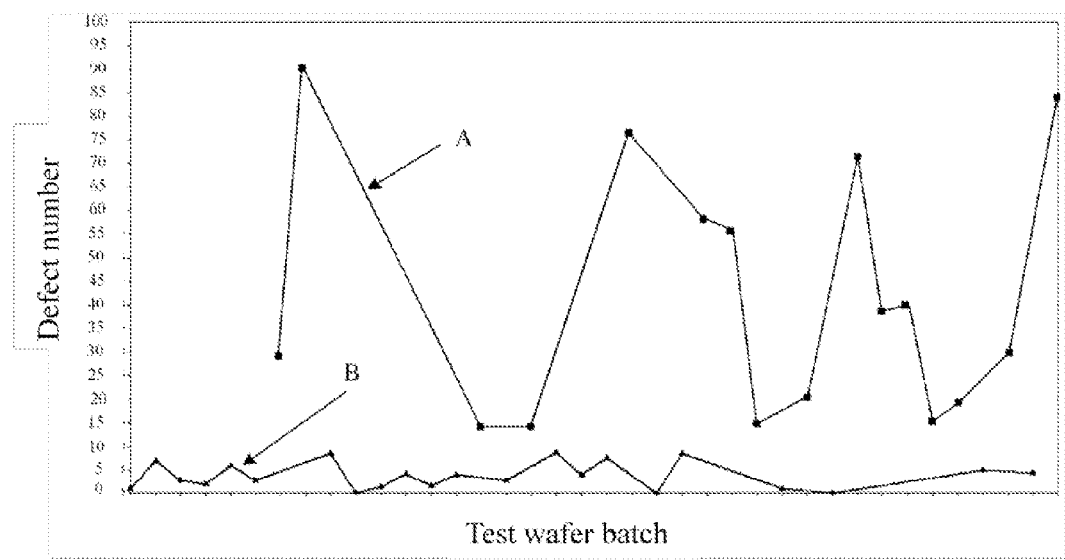

FIG. 10 illustrates the defect numbers of different batch of wafers. Curve "A" illustrates the defect number of different batches of wafers having the first dielectric layer formed by the process illustrated in FIG. 1. The process illustrated in FIG. 1 includes forming the first dielectric layer 104 with the surface higher than the stop layer 103 on the device structures 101 by a HARP; and followed by polishing the first dielectric layer 104 until the gate electrode layer 110 is exposed. Curve "B" illustrates the defect number of different batches of wafers having the first dielectric layer 104 formed by the disclosed method. The wafers all go through three sequential polishing processed to expose the gate electrode layer 211.

As shown in FIG. 10, after forming the densified first dielectric layer 204 with the surface lower than the surface of the stop layer 203 on the top surface of the gate structure 201 by the densify HARP and performing the three times of polishing process, the defects on the third polishing surface P3 of the wafers having the dielectric layer 204 formed by the disclosed methods may be significantly reduced.

Figure 8:
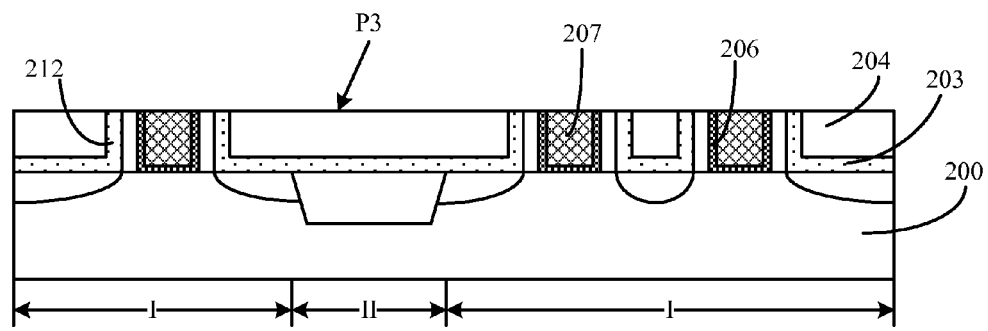

Returning to FIG. 11, after forming the third polishing surface P3, the gate dielectric layer 210 and the gate electrode layer 211 may be removed; and a high-K dielectric layer and a metal gate may be formed (S107). FIG. 8 illustrates a corresponding semiconductor structure.

As shown in FIG. 8, after forming the third polishing surface P3, the gate dielectric layer 210 and gate electrode layer 211 are removed, thus an opening (not labeled) may be formed. Then, a high-K dielectric layer 206 may be formed on the side and bottom surfaces of the opening; and a metal gate 207 may be formed on the surface of the high-K dielectric layer 205 to fill the opening.

The gate electrode layer 211 may be removed by any appropriate process, such as a dry etching process, or a wet etching process, etc. The gate dielectric layer 210 may be removed by any appropriate process, such as a dry etching process, or a wet etching process, etc.

The high-K gate dielectric layer 206 may be made of any appropriate material, such as one or more of $HfO_2$, HfSiO, HfSiON, HfTaO, HfZrO, $Al_2O_3$, and $ZrO_2$, etc. The metal gate 207 may be made of any appropriate material, such as Al, Cu, or Ti, etc. Thus, the formed semiconductor device may be a transistor having a high-K metal gate (HKMG) structure.

A method for forming the high-K gate dielectric layer 206 and the metal gate 207 may include sequentially forming a high-K dielectric film (not shown) on the surface of the third polishing surface P3 and the top and bottom surfaces of the opening; forming a metal film (not shown) on the high-K dielectric film to fill the opening; and planarizing the high-K dielectric film and the metal film until the third polishing surface P3 is exposed.

The high-K dielectric film may be formed by any appropriate process, such as a CVD process, a PVD process, or an FCVD process, etc. The metal film may be formed by any appropriate process, such as a CVD process, a PVD process, an FCVD process, or an electroplating process, etc.

The surface of the third polishing surface P3 may be even and smooth, thus residues may not be easy to adhere to the surface the third polishing surface P3 when the metal film and the high-K dielectric film are planarized. With the absence of such residues, the electrical isolation between adjacent metal gates 207 may match the design requirements; and it may not generate a leakage current between metal gates 207. Therefore, the performance of the transistors having the HKMG structures formed by the disclosed methods may be significantly stable.

Thus, a semiconductor device may be formed by the above disclosed processes and methods; and the corresponding structure is illustrated in FIG. 8. As shown in FIG. 8, the semiconductor device includes a semiconductor substrate 200 having device regions II, peripheral regions II. The semiconductor device also includes high-K metal gate structures having a high-K dielectric layer 206 and a metal gate 207 formed on the surface of the semiconductor substrate 200 in the device regions II. Further, the semiconductor device includes sidewall spacers (not labeled) formed on the side surface of the high-K metal gate structures; and a stop layer 203 formed on the surface of the semiconductor substrate 200 and the sidewall spacers. Further, the semiconductor device also includes a densified first dielectric layer 204 formed on the surface of the stop layer 203; source/drain regions formed in the semiconductor substrate 200 at both sides of the high-K metal gate structures; and isolation structures formed in the semiconductor substrate 200 in the peripheral regions II. The detailed structures and intermediate structures are described above with respect to the fabrication processes.

In one embodiment, the first dielectric layer may be formed by a density high aspect ratio process, the density and the hardness of the first dielectric layer may be increased, thus the densified first dielectric layer does not need to be unnecessarily be relatively thick, and it may only need to fill the trenches between adjacent device structures. Further, when the trenches are filled by the densify high aspect ratio process, it may ensure that the surface of the densified first dielectric layer in the peripheral region to be lower the surface of the stop layer on the top surface of the device structures. When the subsequent second polishing process is performed to planarize the first polishing surface to form the second polishing surface, the surface of the first dielectric layer in the peripheral region may have a second distance with the second polishing surface. That is, only the second dielectric layer is exposed by the second polishing surface in the peripheral region. Because the density of the second dielectric layer may be greater, or equal to the density of the first dielectric layer, the second polishing process may not scratch the surface of the first dielectric layer in the peripheral region, thus it may be able to ensure the second polishing surface to be even and smooth such that the third polishing surface formed by the subsequent third polishing process may be kept even and smooth as well. Therefore, the subsequent processes may not form residues on the third polishing surface, it may prevent forming a leakage current between adjacent device structures; and the performance of the formed semiconductor devices may be stable.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor device, comprising:
   providing a substrate having a device region and a peripheral region;
   forming a plurality of device structures on a surface of the substrate in the device region so as to form trenches between adjacent device structures;
   forming a stop layer on the surface of the substrate and the device structures;
   forming a densified first dielectric layer with an increased hardness on the stop layer such that a portion of the densified first dielectric layer fills the trenches in the device region and a top surface of a portion of the densified first dielectric layer in the peripheral region is lower than a surface of the stop layer on the top surface of the device structures by a densify high aspect ratio process;
   forming a second dielectric layer on the densified first dielectric layer; and
   performing a plurality of polishing processes onto the second dielectric layer and the densified first dielectric layer until a top surface of the device structures is exposed.

2. The method according to claim 1, wherein performing a plurality of polishing processes further includes:
performing a first polishing process to planarize the second dielectric layer to form a first polishing surface until the first polishing surface and the surface of the stop layer on the top surface of the device structures has a pre-determined first distance;
performing a second polishing process onto the first polishing surface to form a second polishing surface until the surface of the stop layer on the top surface of the device structures is exposed and the surface of the densified first dielectric layer in the peripheral region and the second polishing surface have a pre-determined second distance; and
performing a third polishing process to planarize the second polishing surface until the top surface of the device structures is exposed.

3. The method according to claim 2, wherein:
the second polishing process is a chemical mechanical polishing process using fix abrasive; and
the first polishing process and the third polishing process are chemical mechanical polishing processes using polishing slurry.

4. The method according to claim 2, wherein:
the first polishing surface is formed by performing the first polishing process until the surface of the densified first dielectric layer on the top surface of the device structures is exposed.

5. The method according to claim 2, after performing the third polishing process, further including:
removing the gate dielectric layer and the gate electrode layer to form an opening;
forming a high-K gate dielectric layer on side and bottom surfaces of the opening; and
forming a metal gate on the high-K dielectric layer to fill the opening.

6. The method according to claim 2, wherein:
the first distance is in a range of approximately 300 Å~500 Å; and
the second distance is in a range of approximately 150 Å~200 Å.

7. The method according to claim 1, wherein:
the densified first dielectric layer and the second dielectric layer is made of silicon oxide; and
the stop layer is made of silicon nitride.

8. The method according to claim 7, wherein:
precursors for the densify high aspect ratio process include tetraethyl orthosilicate (TEOS) and ozone;
a flow of TEOS is in a range of approximately 400 sccm~1000 sccm;
a flow of ozone is in a range of approximately 1800 sccm~3000 sccm;
a pressure of the densify high aspect ratio process is in a range of approximately 500 Torr~800 Torr; and
a temperature of the densify high aspect ratio process is in a range of approximately 400° C.~450° C.

9. The method according to claim 7, wherein:
a polishing rate of the second polishing process to the densified first dielectric layer is in a range of 3 Å/min~4 Å/min.

10. The method according to claim 7, wherein:
the second dielectric layer is formed by a chemical vapor deposition process.

11. The method according to claim 10, wherein:
the chemical vapor deposition process is a plasma-enhanced chemical vapor deposition process.

12. The method according to claim 11, wherein:
precursors of the plasma-enhanced chemical vapor deposition process include tetraethyl orthosilicate (TEOS) oxygen and helium;
a pressure of the plasma-enhanced chemical vapor deposition process is in a range of approximately 1 Torr~10 Torr;
a temperature of the plasma-enhanced chemical vapor deposition process is in a range of approximately 360° C.~420° C.;
a radio frequency power of the plasma-enhanced chemical vapor deposition process is in a range of approximately 400 W~2000 W;
a flow of oxygen is in a range of approximately 500 sccm~4000 sccm;
a flow of TEOS is in a range of approximately 500 sccm~5000 sccm; and
a flow of helium is in a range of approximately 1000 sccm~5000 sccm.

13. The method according to claim 1, wherein:
the device structure is a gate structure having a gate dielectric layer formed on the surface of the substrate, a gate electrode layer formed on the gate dielectric layer and sidewall spacers formed on both sides of the gate dielectric layer and the gate electrode layer.

14. The method according to claim 13, wherein:
the gate dielectric layer is made of silicon oxide; and
the gate electrode layer is made of poly silicon.

15. The method according to claim 1, wherein:
a distance between the surface of the semiconductor substrate and the surface of the stop layer on the top surface of the device structures is in a range of approximately 650 Å~750 Å.

16. A semiconductor device, comprising:
a substrate having a device region and a peripheral region;
a plurality high-K metal gate structures formed on a surface of the substrate in the device region;
an isolation structure formed in the substrate in the peripheral region;
a stop layer formed on the surface of the substrate; and
a densified first dielectric layer with an increased hardness formed on the surface of stop layer by a densify high aspect ratio process, wherein the densified first dielectric layer is formed by:
forming a densified first dielectric layer on the stop layer such that a portion of the densified first dielectric layer fills trenches between adjacent gate structures in the device region and a top surface of a portion of the densified first dielectric layer in the peripheral region is lower than a surface of the stop layer on the top surface of the gate structures by the densify high aspect ratio process;
forming a second dielectric layer on the densified first dielectric layer;
performing a first polishing process to planarize the second dielectric layer to form a first polishing surface until the first polishing surface and the surface of the stop layer on the top surface of the gate structures has a pre-determined first distance;
performing a second polishing process onto the first polishing surface to form a second polishing surface until the surface of the stop layer on the top surface of the gate structures is exposed and the surface of the densified first dielectric layer in the peripheral region and the second polishing surface have a pre-determined second distance; and performing a third polishing process to planarize the second polishing surface until the top surface of the device structures is exposed.

17. The semiconductor device according to claim 16, wherein:
the second dielectric layer is formed by a plasma-enhanced chemical vapor deposition process.

18. The semiconductor device according to claim 16, wherein:
a thickness of the densified first dielectric layer on the top surface of the gate structures is in a range of approximately 400 Å~500 Å; and
a thickness of the first dielectric layer on the surface of the stop layer in the peripheral region is in a range of approximately 500 Å~600 Å.

19. The semiconductor device according to claim 16, wherein:
a height-to-width aspect ratio of the trenches between adjacent gate structures is greater than approximately 5:1.

* * * * *